US008854099B1

(12) United States Patent
Miao

(10) Patent No.: US 8,854,099 B1
(45) Date of Patent: Oct. 7, 2014

(54) METHOD AND APPARATUS FOR HIGH RESOLUTION DELAY LINE

(71) Applicant: Analog Devices, Inc., Norwood, MA (US)

(72) Inventor: Botao Miao, Sunnyvale, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/061,270

(22) Filed: Oct. 23, 2013

(51) Int. Cl.
 *H03H 11/26* (2006.01)
 *H03K 5/14* (2014.01)
 *H03K 5/06* (2006.01)
(52) U.S. Cl.
 CPC ... *H03K 5/06* (2013.01); *H03K 5/14* (2013.01)
 USPC .......................................................... 327/261
(58) Field of Classification Search
 USPC .......................................................... 327/261
 See application file for complete search history.

(56) References Cited

U.S. PATENT DOCUMENTS

2007/0120609 A1* 5/2007 Dietl et al. ........................ 331/16
2010/0020004 A1* 1/2010 Smith ............................ 345/102

* cited by examiner

*Primary Examiner* — Daniel Rojas
(74) *Attorney, Agent, or Firm* — Schwegman Lundberg & Woessner, P.A.

(57) ABSTRACT

The present subject matter discusses, among other things, apparatus and methods for a delay line. In an example, a delay device can include a first node, a plurality of variable capacitor circuits configured to receive a capacitance set point voltage, a current source, a plurality of switches configured to selectively couple a respective variable capacitor of the plurality of variable capacitors to the first node, an input switch configured to receive an input signal and to couple and decouple the current source to the first node responsive to a state of the input signal, and a comparator configured to receive a reference voltage, to receive a voltage from the first node, and to provide an binary output indicative of a comparison between the reference voltage and the voltage from the first node, wherein the binary output is a delayed representation of the input signal.

24 Claims, 4 Drawing Sheets

METHOD AND APPARATUS FOR HIGH RESOLUTION DELAY LINE

BACKGROUND

Counter-based digital pulse width modulator (DPWM) and digital delay locked loop (DLL) are the common implementations for delay lines. However, as speed requirements for delay lines increase, these implementations can require costly resources for reliable implementation. Counter-based DPWMs become impractical for delay lines as speed requirements increase because of the need for even higher speed clocks. For example, if one percent of a the DPWM resolution is required in a 1 megahertz (1 MHz) switching frequency converter, a 1 gigahertz system clock is needed which can make the implementation impractical for a given application.

A DLL based solution can be low power but can consume a large circuit area. In addition, the delay generated is the integer multiple of one cell delay. At current 0.18 um process, the delay of one cell (e.g., inverter) is limited to about 80 ps and can vary by process, temperature and voltage. Hence, the increment or decrement of the delay is large and can cause nonlinearity.

OVERVIEW

The present subject matter discusses, among other things, apparatus and methods for a delay line. In an example, a delay device can include a first node, a plurality of variable capacitor circuits configured to receive a capacitance set point voltage, a current source, a plurality of switches configured to selectively couple a respective variable capacitor of the plurality of variable capacitors to the first node, an input switch configured to receive an input signal and to couple and decouple the current source to the first node responsive to a state of the input signal, and a comparator configured to receive a reference voltage, to receive a voltage from the first node, and to provide an binary output indicative of a comparison between the reference voltage and the voltage from the first node, wherein the binary output is a delayed representation of the input signal.

This overview is intended to provide a partial summary of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In certain digital controlled switched mode power supplies, an analog-to-digital converter (ADC) can convert feedback voltage (or voltage error between the feedback voltage and setting voltage) to digital format, while a digital pulse width modulator (DPWM) can convert a calculated duty cycle to actual pulse width.

Such an implementation can give rise to two quantizes: the A/D converter and the DPWM, which can serve as a digital-to-analog converter (DAC). To avoid a limit cycle and keep high accurate voltage regulation, high resolution of the PWM is required. A basic quantization relation is shown:

$$G_0 q_{DPWM} < q_{ADC} \quad \text{(Eq. 1)}$$

where $G_0$ is the dc duty-cycle-to-output gain, $q_{DPWM}$ and $q_{ADC}$ are the quantization level of DPWM and ADC, respectively. Generally high resolution means low quantization level. In these applications, absolute accuracy of the PWM is de-emphasized due to the closed loop operation.

Figure 1:
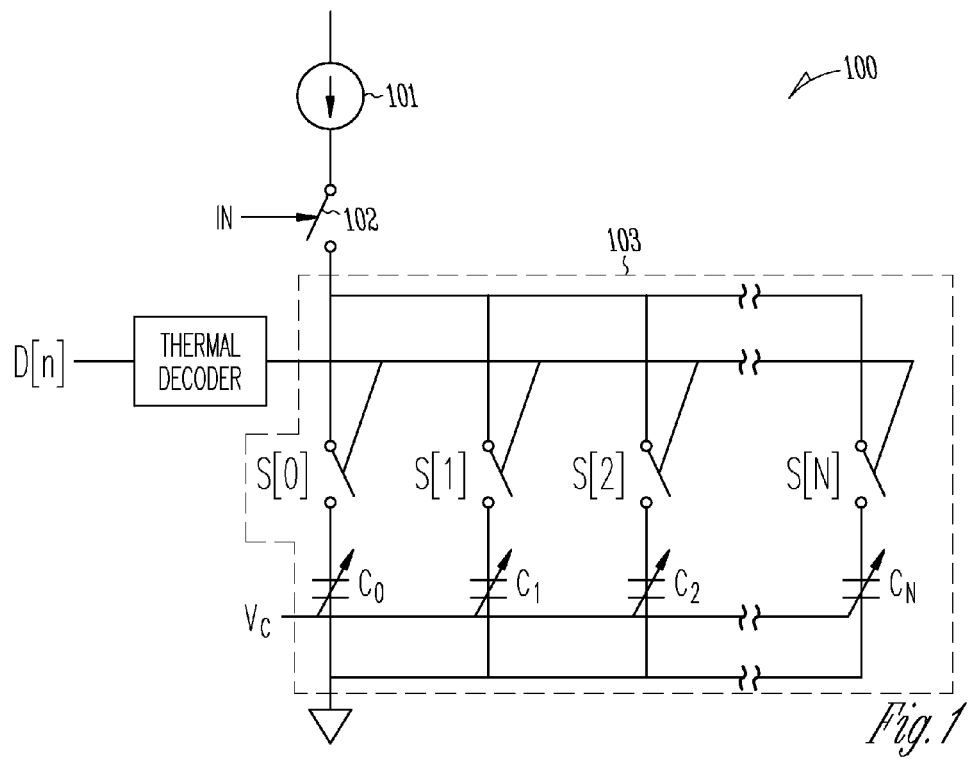
FIG. 1 illustrates generally an example circuit capable of providing a high resolution delay.

FIG. 1 illustrates generally an example circuit 100 capable of providing a high resolution delay. In certain examples, the circuit 100 can include a fixed current source 101, an input switch 102 and a capacitor set 103. The fixed current source 101 can charge the capacitor set 103 and the voltage across the capacitor set can be used to trigger an output of a delay circuit. In certain examples, the capacitor set 103 can include a number (N) of capacitors, each capacitor of the capacitor set 103 can have substantially the same capacitance. In some examples, the capacitor set 103 can include a number (N) of variable capacitors where the capacitance of each capacitor can be adjusted by a set voltage ($V_c$). In certain examples, each capacitor, fixed or variable, within the capacitor set 103 can be turned on or off by a cap switch S[N:0]. So the total capacitance of the capacitor set can be controlled by N cap switches S[N:0]. In certain applications, the example circuit 100 can provide fine delay resolution as part of a larger delay circuit. In certain examples, the current source 101 can be controlled by a logic signal, such as an input pulse (IN) to be delayed. A system clock can be generated by a conventional PLL and the clock signal and a duty cycle command D[M:0], or plurality of delay command signals, can work together to generate a coarse delay. In certain examples, a thermal encoder can receive a number (m) of least significant bits of the duty cycle command D[M:0] and can provide corresponding thermal code bits that can control the cap switches S[N:0]. In this way, the capacitance of the capacitor set 103 can be monotonic even considering the parasitic effect of the example circuit 100. In certain examples, the capacitor set 100 can provide a delay between zero, when the thermal code bits are all zero and a total delay when the thermal code bits are all "1"s. It is understood that additional logic can be used to provide the full scale delay using different patterns if zeroes and ones without departing from the scope of the present subject matter. In certain examples, the set voltage ($V_c$) can be used to adjust the capacitance of each capacitor in the capacitor set 103 to allow the full scale delay to correspond to a coarse delay resolution. In certain examples, the total delay, when all the capacitors are coupled to the first node, can be trimmed or calibrated to a coarse delay through a closed loop operation.

Figure 2:
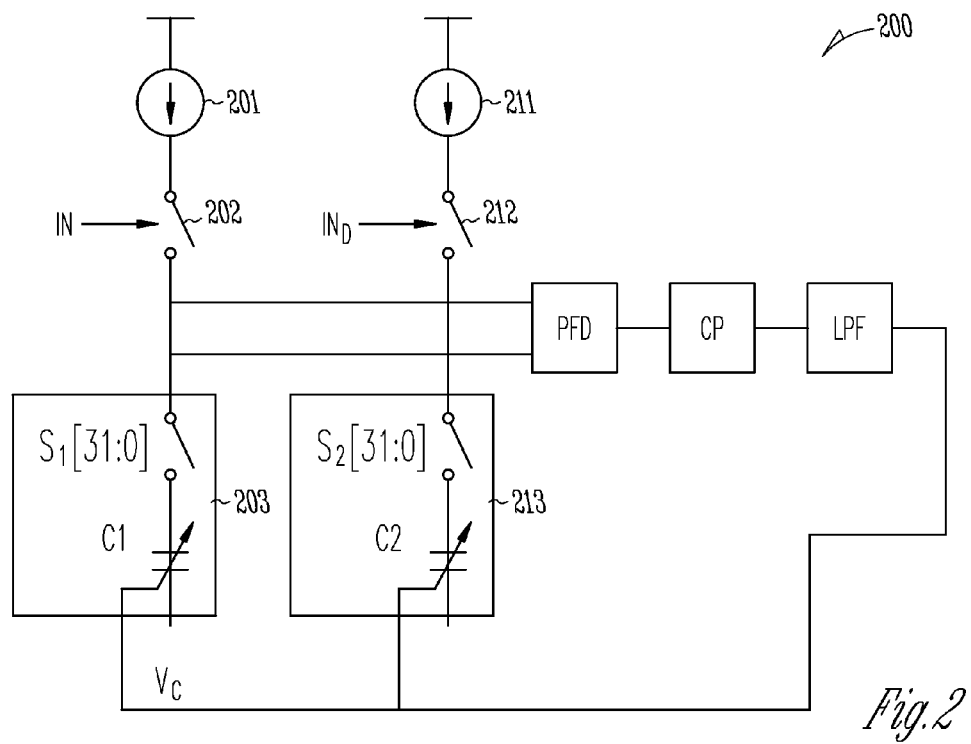
FIG. 2 illustrates generally an example calibration circuit for calibrating a set voltage of a set of variable capacitors.

FIG. 2 illustrates generally an example calibration circuit 200 for calibrating the set voltage ($V_c$). In certain examples, the calibration circuit 200 can include first and second current sources 201, 211, first and second input switches 202, 212, first and second capacitor sets 203, 213, a phase frequency detector (PFD), a charge pump (CP), and a low-pass filter (LPF). During a calibration mode or a trim mode, the thermal code bits (not shown) for the first capacitor set 203 are set to select a maximum delay (e.g., all the capacitors enabled) and the thermal code bits (not shown) for the second capacitor set 213 are set to select no delay. During the calibration mode, a first input signal edge (IN) can enable the first input switch 202 to couple the first current source 201 to the first capacitor set 203 and a second input signal edge ($IN_D$) can enable the second input switch 212 to couple the second current source 211 to the second capacitor set 213. In some examples, the second input signal edge ($IN_D$) can be delayed from the first input signal edge (IN) by a predetermined delay such as a single coarse delay interval of a DPWM. The phase frequency detector (PFD) can detect a phase difference between the delayed capacitor voltage of the first capacitor set 203 and the un-delayed capacitor voltage of the second capacitor set 213 and can use the error to drive the charge pump (CP) to provide the set voltage ($V_c$). In certain examples, the low-pass filter (LPF) can smooth and stabilize the set voltage ($V_c$). After calibration, the maximum delay provided by the first capacitor set 203 can be equal to a single coarse delay interval. In addition, the resolution of the fine delay can be substantially equal to the minimum coarse delay interval divided by the number of capacitors in the first capacitor set 203.

Figure 3:
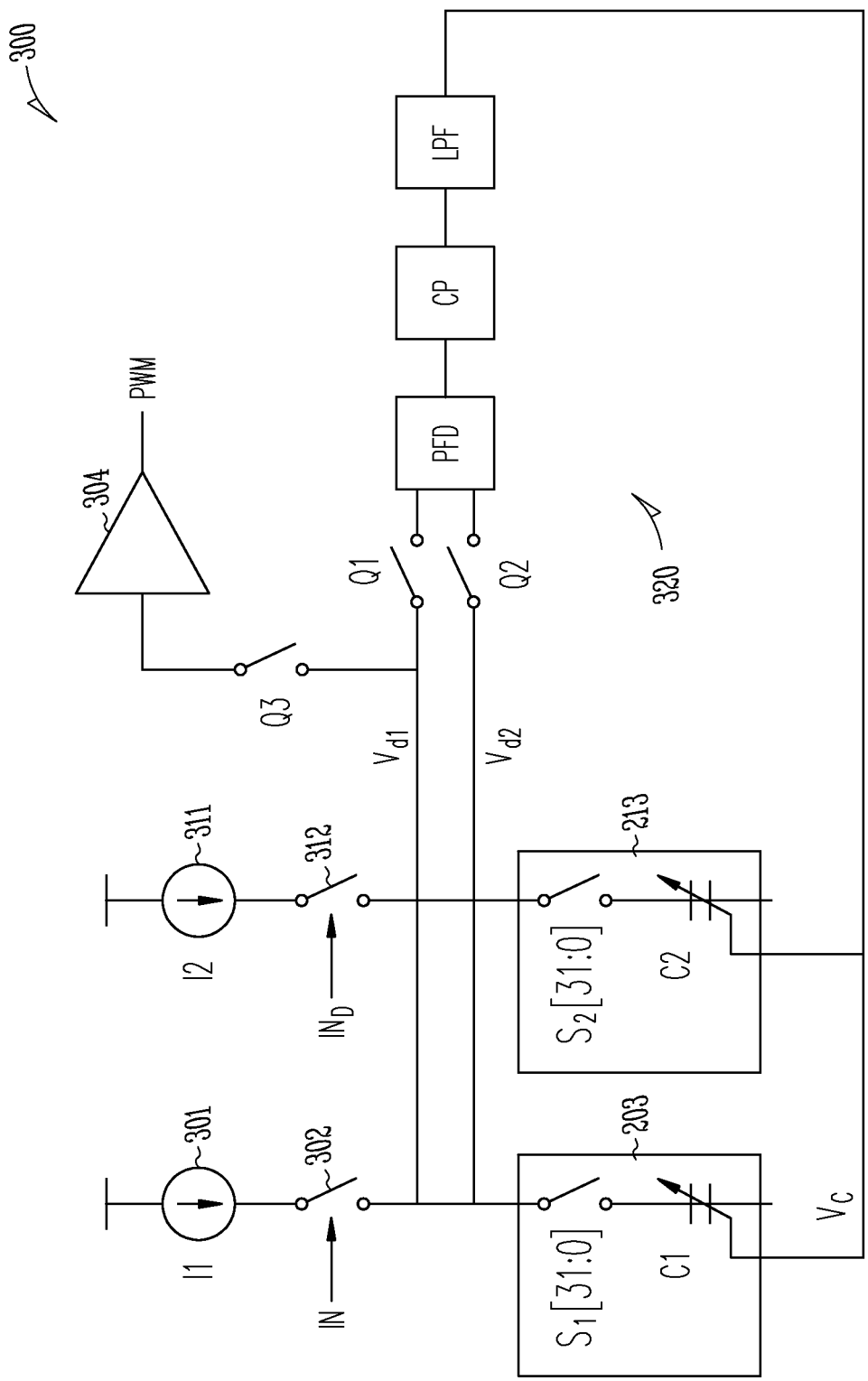
FIG. 3 illustrates generally an example delay line circuit including calibration feedback.

FIG. 3 illustrates generally an example delay line circuit 300 including calibration feedback as discussed above with reference to FIG. 2. In certain examples, the delay line circuit 300 can include first and second current sources 301, 311, first and second input switches 302, 312, first and second capacitor sets 303, 313, calibration switches (Q1, Q2), calibration feedback components 320, a delay mode switch (Q3) and a buffer 304.

In certain examples, upon entering a calibration mode, or a trim mode, the delay mode switch (Q3) can isolate the capacitor voltage (Vd1) across the first capacitor set 303 from the buffer 304, and the calibration switches (Q1, Q2) can couple the capacitor voltage (Vd1) across the first capacitor set 303 and the capacitor voltage (Vd2) across the second capacitor set 313 to the calibration feedback components 320. During the calibration mode, thermal code bits for the first capacitor set 303 can be set to select a maximum delay (e.g., all the capacitors enabled) and the thermal code bits for the second capacitor set 313 can be set to select no delay. During the calibration mode, a first input signal edge (IN) can enable the first input switch (302) to couple the first current source 301 to the first capacitor set 303 and a second input signal edge ($IN_D$) can enable the second input switch 312 to couple the second current source 311 to the second capacitor set 313. In some examples, the second input signal edge ($IN_D$) can be delayed from the first input signal edge (IN) by a predetermined delay such as a single coarse delay of a DPWM. A phase frequency detector (PFD) can detect a phase difference between the delayed capacitor voltage (Vd1) of the first capacitor set 303 and the un-delayed capacitor voltage (Vd2) of the second capacitor set 313 and can provide the error to drive a charge pump (CP) to provide the set voltage ($V_c$). In certain examples, the low-pass filter (LPF) can smooth the set voltage ($V_c$). After calibration, the maximum delay provided by the first capacitor set (303) can be equal to a minimum coarse delay interval. In addition, the resolution of the fine delay can be substantially equal to the single coarse delay interval divided by the number of capacitors in the first capacitor set (303). In certain examples, the first and second capacitor sets 303, 313 can be matched, such as by forming the capacitor sets on a single integrated circuit chip. Since only the difference between the delayed signals is used in the loop, common parasitic parameters of the capacitor sets 303, 313, as well as the overall circuit 300, have no effect.

Upon entering a delay mode, the calibration switches (Q1, Q2) can isolate the first and second capacitor sets (303, 313) from the calibration feedback components 320 while the set voltage ($V_c$) can be maintained, and the delay switch (Q3) can couple the first capacitor set 303 to the buffer 304. In certain examples, the buffer 304 can include a comparator to toggle the output signal (PWM) of the buffer 304 between two logic levels using a comparison of a reference voltage or hysteretic reference voltage levels to the voltage across the first capacitor set (Vd1). In the delay mode, a controller (not shown) can provide a duty cycle command and a portion of the duty cycle command can be converted to thermal code bits to select one or more of the variable capacitors of the first capacitor set 303 to receive current from the first current source 301. In certain examples, the first current source 301 can be coupled to the first capacitor set 303 using the first input switch 301 to charge the capacitance of the first capacitor set 303. As the voltage (Vd1) across the first capacitor set 303 satisfies a threshold of the buffer 304, the output of the buffer 304 can change state creating a delayed representation (PWM) of the input signal (IN) at the output of the buffer 304.

Figure 4:
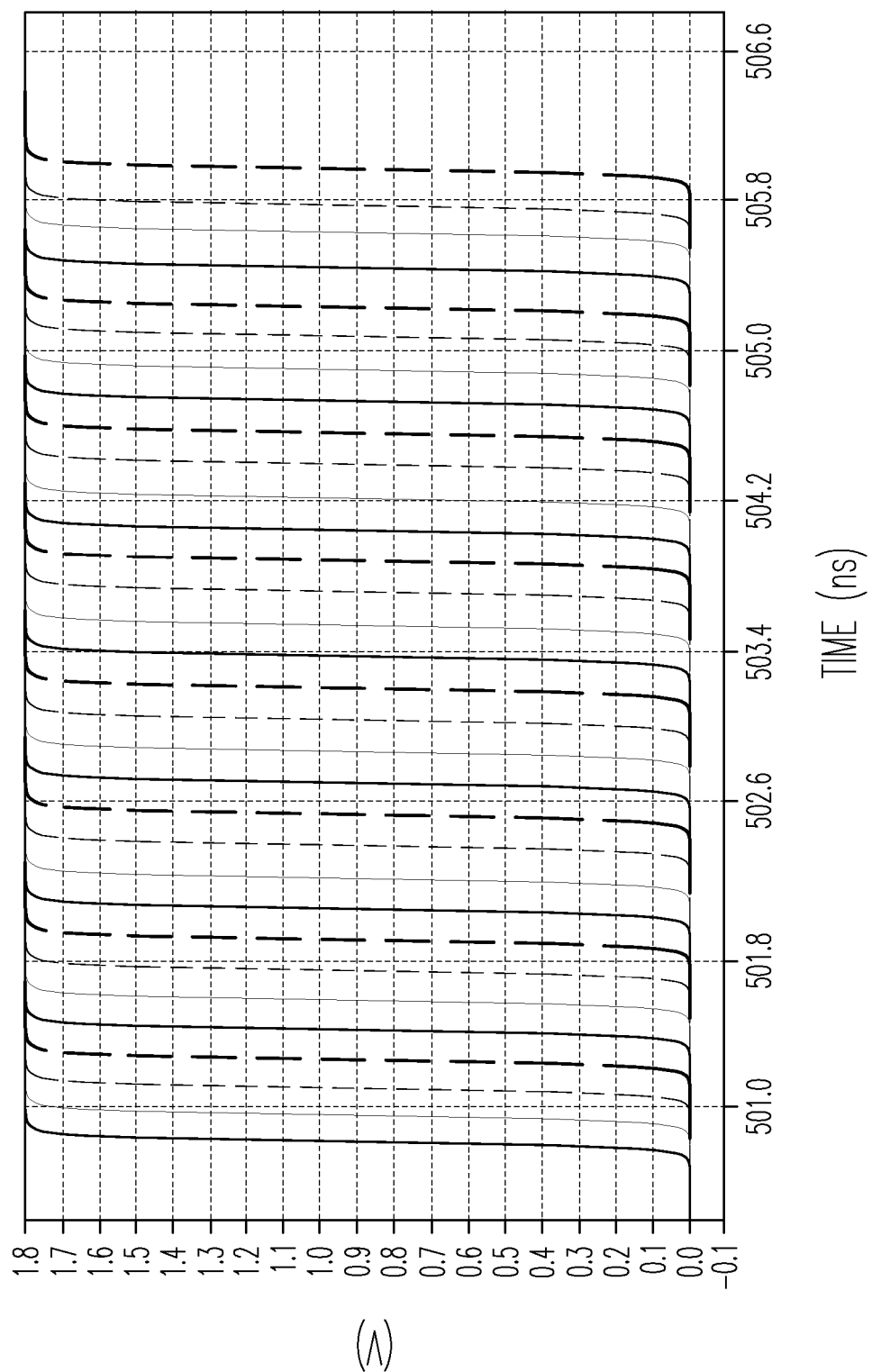
FIG. 4 illustrates graphically the switching resolution of an example DPWM

FIG. 4 illustrates graphically the switching resolution of an example DPWM having a 5 nanosecond (ns) coarse delay interval and 32 capacitors in a capacitor set. It is understood that an example capacitor set can include more or less capacitors without departing from the scope of the present subject matter. The graphical representation illustrates that the fine delay associated with the capacitor set can provide a resolution equal to 5 ns/32 or about 150 picoseconds (ps). As can be seen, the minimum fine delay can be proportional to the number of capacitors in the capacitor set. In certain examples, a 5 ns coarse interval resolution can be achieved using a PLL to generate a 200 MHz clock and delay elements selected in accordance with the most significant bits of a duty cycle command or a delay command. A fine delay can be achieved by selecting one or more capacitors within a capacitor bank circuit in accordance with the least significant bits of the duty cycle command or the delay command as discussed above. Thus, a high resolution delay line can be realized without requiring a clock with a frequency significantly higher than the base frequency of the PLL and without the associated high frequency components.

Figure 5:
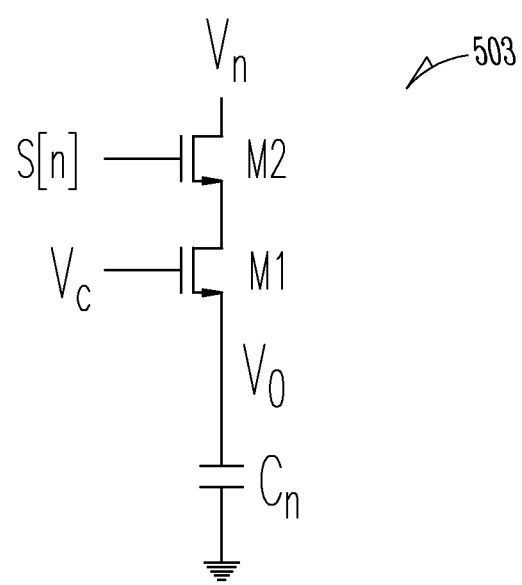
FIG. 5 illustrates generally an example variable capacitor circuit.

FIG. 5 illustrates generally an example variable capacitor 503 and a cap switch (M2). In certain examples, the capacitor ($C_n$) can include a metal-oxide semiconductor (MOS) capacitor and a charge transistor (M1). In operation, a signal, such as a thermal encoder signal S[n], can control the cap switch (M2) to couple and decouple the variable capacitor 503 with a current source (not shown). In some examples, the charge transistor is biased with a set voltage ($V_c$) to establish a desired charge delay. In certain examples, when the capacitor voltage ($V_0$) is larger than the set voltage ($V_c$) minus the threshold voltage ($V_t$) of the transistor (M1), the transistor is off and isolates the capacitor ($C_n$) from the cap switch (M2) as well as the charging current. In certain examples, the capacitance connected to the current source can be proportional to the set voltage ($V_c$). In certain examples, capacitor voltage rising slopes across each variable capacitor of a capacitor set can differ at low voltage but are substantially the same at high voltage. This feature allows capacitor bank voltage (Vn) to trigger the output comparator or buffer at the same rising slope assuring that the comparator self-delay is constant. It is understood that other variable capacitor implementations are possible for use with a capacitor bank of a high resolution delay line without departing from the scope of the present subject matter.

Additional Notes

Each of the non-limiting examples discussed in this document can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A delay device comprising:
   a first node;
   a plurality of variable capacitor circuits configured to receive a capacitance set point voltage;
   a current source;
   a plurality of switches configured to selectively couple a respective variable capacitor of the plurality of variable capacitors to the first node;
   an input switch configured to receive an input signal and to couple and decouple the current source to the first node responsive to a state of the input signal; and
   a comparator configured to receive a reference voltage, to receive a voltage from the first node, and to provide an binary output indicative of a comparison between the reference voltage and the voltage from the first node, wherein the binary output is a delayed representation of the input signal.

2. The delay device of claim 1, wherein a delay interval between a transition of the input signal and a transition of the output signal is related to a state of the plurality of switches.

3. The delay device of claim 1, wherein a delay interval between a transition of the input signal and a transition of the output signal is related to a value of the capacitance set point voltage.

4. The delay device of claim 1, including a calibration circuit configured to provide the capacitance set point voltage.

5. The delay device of claim 4, wherein the calibration circuit includes:
   a second node;
   a second plurality of variable capacitor circuits configured to receive the capacitance set point voltage;
   a second current source;
   a second plurality of switches configured to selectively couple each variable capacitor of the second plurality of variable capacitors to the second node;
   a second input switch configured to receive a second input signal and to couple and decouple the second current source to the second node responsive to a state of the second input signal;
   a phase frequency detector configured to receive the voltage from the first node and a voltage from the second node and to provide a phase difference signal representative of a time difference between a transition of the voltage from the first node and the voltage from the second node.

6. The delay device of claim 5, wherein the calibration circuit includes a charge pump configured to receive the phase difference signal and to provide the capacitance set point voltage.

7. The delay device of claim 6, wherein the calibration circuit includes a low-pass filter to stabilize the capacitive set point voltage.

8. The delay device of claim 5, including a controller configured to couple the first node to the comparator and to decouple the first node from the phase frequency detector during a delay mode of the delay device and to couple the first node to the phase frequency detector during a closed loop mode of the delay device.

9. The delay device of claim 5, wherein a single integrated circuit chip includes the plurality of variable capacitor circuits and the second plurality of variable capacitor circuits to reduce variations due to process, temperature, and supply voltage.

10. The delay device of claim 1, wherein each variable capacitor circuit of the plurality of variable capacitor circuits includes:
  a capacitor having a first node coupled to each other capacitor circuit of the plurality of capacitor circuits; and
  a set point transistor coupled between the capacitor and a switch of the plurality of switches and configured to receive the capacitance set point signal at a control node.

11. The delay device of claim 1, including a coarse delay circuit configured to provide a plurality of delay intervals, wherein immediately sequential delay intervals are separated by a coarse interval, the coarse delay circuit configured to provide the input signal.

12. The delay device of claim 1, wherein a minimum delay interval of the delayed representation of the input signal is inversely proportional to the number of variable capacitor circuits in the plurality of variable capacitor circuits.

13. A method of operating a delay device, the method comprising:
  receiving a plurality of delay command signals at the delay device;
  individually coupling one or more variable capacitor circuits of a plurality of variable capacitor circuits to a first node in accordance with a state of the plurality of delay command signals using a plurality of switches;
  receiving a transition of a course delay signal at an input switch of the delay device;
  coupling a current source to the first node using the input switch;
  charging the one or more variable capacitor circuits using the current source; and
  comparing a voltage of the first node to a reference voltage to provide a delayed representation of the coarse delay signal during a delay mode of the delay device.

14. The method of claim 13, including biasing each of the variable capacitors according to a capacitance set point voltage to provide a desired delay interval between the transition of the coarse delay signal and the delayed representation of the coarse delay signal.

15. The method of claim 14, wherein the biasing includes receiving a capacitance set point voltage at a control node of a charge transistor of each of the variable capacitor circuits, each of the charge transistors configured to charge a capacitor of each of the variable capacitor circuits.

16. The method of claim 14, including coupling the first node to the comparator to establish a delay mode of the delay device.

17. The method of claim 16, including coupling the first node to a phase frequency detector to establish a closed loop mode of the delay device.

18. The method of claim 17, including:
  receiving a transition of an second coarse delay signal at a second input switch of the delay device;
  coupling a second current source to a second node using the second input switch; and
  receiving a voltage of the second node an the phase frequency detector; and
  providing a phase difference signal representative of a time difference between a transition of the voltage from the first node and a transition of the voltage from the second node.

19. The method of claim 18, including:
  receiving the phase difference signal at an input of a charge pump; and
  providing the capacitance set point voltage using the charge pump and the phase difference signal.

20. The method of claim 19, including stabilizing the capacitance set point voltage using a low-pass filter.

21. A digital pulse width modulator comprising:
  a controller to provide a digital delay command;
  a coarse delay circuit configure to receive an input signal and the digital delay command and to provide a coarse delayed representation of the input signal; and
  a fine delay circuit configured to receive the coarse delayed representation of the input signal and the digital delay command, to process a fine delay interval, and to provide a delayed representation of the input signal using the coarse delayed representation of the input signal and the fine delay;
  wherein the fine delay circuit includes:
    a first node;
    a plurality of variable capacitor circuits configured to receive a capacitance set point voltage;
    a current source;
    a plurality of switches configured to selectively couple each variable capacitor of the plurality of variable capacitors to the first node using the digital delay command;
    an input switch configured to receive the coarse delayed representation of the input signal and to couple and decouple the current source to the first node responsive to a state of the coarse delayed representation of the input signal; and
    a comparator configured to receive a reference voltage, to receive a voltage from the first node, and to provide an binary output indicative of a comparison between the reference voltage and the voltage from the first node, wherein the binary output includes the delayed representation of the input signal.

22. The digital pulse width modulator of claim 21, including a converter configured to receive a plurality of least significant bits of the digital delay command and provide a thermal code equivalent command to control the plurality of switches of the fine delay circuit.

23. The digital pulse width modulator of claim 21, wherein a minimum coarse delay interval of the coarse delay circuit is about 5 nanoseconds.

24. The digital pulse width modulator of claim 21, wherein a minimum fine delay interval of the fine delay circuit is about 150 picoseconds.

* * * * *

UNITED STATES PATENT AND TRADEMARK OFFICE
CERTIFICATE OF CORRECTION

PATENT NO. : 8,854,099 B1  
APPLICATION NO. : 14/061270  
DATED : October 7, 2014  
INVENTOR(S) : Botao Miao Page 1 of 1

It is certified that error appears in the above-identified patent and that said Letters Patent is hereby corrected as shown below:

In The Drawings

On Sheet 2 of 4, Fig. 3, reference numeral 203, delete "203" and insert --303--, therefor On Sheet 2 of 4, Fig. 3, reference numeral 213, delete "213" and insert --313--, therefor In The Claims In column 8, line 5, in Claim 18, delete "an" and insert --a--, therefor In column 8, line 9, in Claim 18, delete "an" and insert --and--, therefor In column 8, line 24, in Claim 21, delete "configure" and insert --configured--, therefor In column 8, line 49, in Claim 21, delete "an" and insert --a--, therefor Signed and Sealed this  
Eighteenth Day of August, 2015

Michelle K. Lee  
*Director of the United States Patent and Trademark Office*